(12) United States Patent
Wu et al.

(10) Patent No.: US 8,999,833 B1
(45) Date of Patent: Apr. 7, 2015

(54) METHOD AND APPARATUS FOR CONTROLLING GATE DIMENSIONS OF MEMORY DEVICES

(71) Applicant: Taiwan Semiconductor Manufacturing Company, Ltd., Hsin-Chu (TW)

(72) Inventors: Chang-Ming Wu, New Taipei (TW); Shih-Chang Liu, Alian Township (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/045,899

(22) Filed: Oct. 4, 2013

(51) Int. Cl.
*H01L 21/3205* (2006.01)
*H01L 21/4763* (2006.01)
*H01L 29/423* (2006.01)
*H01L 21/28* (2006.01)
*H01L 27/115* (2006.01)
*H01L 29/66* (2006.01)
*H01L 29/788* (2006.01)

(52) U.S. Cl.
CPC .... *H01L 29/42328* (2013.01); *H01L 21/28273* (2013.01); *H01L 27/11521* (2013.01); *H01L 29/66825* (2013.01); *H01L 29/788* (2013.01)

(58) Field of Classification Search
CPC .............. H01L 21/28273; H01L 27/11521; H01L 29/42328; H01L 29/66825; H01L 29/788

USPC ........................ 438/593; 257/E21.209, E29.3
See application file for complete search history.

(56) References Cited

U.S. PATENT DOCUMENTS

| | | | |
|---|---|---|---|
| 7,663,179 B2 * | 2/2010 | Shinohara et al. ............ | 257/316 |
| 2012/0068243 A1 * | 3/2012 | Kawashima et al. ......... | 257/315 |
| 2013/0026552 A1 | 1/2013 | Toh et al. | |
| 2013/0126960 A1 * | 5/2013 | Chakihara et al. ............ | 257/324 |

OTHER PUBLICATIONS

Tiwari, S., et al., "A silicon nanocrystals based memory," Applied Physics Letters 68, Mar. 4, 1996, pp. 1377-1379.

* cited by examiner

*Primary Examiner* — David S Blum
(74) *Attorney, Agent, or Firm* — Slater & Matsil, L.L.P.

(57) ABSTRACT

A device comprises a control gate structure over a substrate, a memory gate structure over the substrate, wherein the memory gate structure comprises a memory gate electrode and a memory gate spacer, and wherein the memory gate spacer is over the memory gate electrode, a charge storage layer formed between the control gate structure and the memory gate structure, wherein the charge storage layer is an L-shaped structure, a first spacer along a sidewall of the memory gate structure, a first drain/source region formed in the substrate and adjacent to the memory gate structure and a second drain/source region formed in the substrate and adjacent to the control gate structure.

20 Claims, 13 Drawing Sheets

METHOD AND APPARATUS FOR CONTROLLING GATE DIMENSIONS OF MEMORY DEVICES

BACKGROUND

Modern electronic devices such as a notebook computer comprise a variety of memories to store information. Memory circuits include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them. Non-volatile memories include a variety of sub-categories, such as read-only-memory (ROM), electrically erasable programmable read-only memory (EEPROM) and flash memory.

One type of EEPROM memory device is referred to as a flash memory device. Flash memories have become increasingly popular in recent years. A typical flash memory comprises a memory array having a large number of memory cells arranged in rows and columns. Each of the memory cells is fabricated as a field-effect transistor having a drain region, a source region, a control gate and a floating gate.

The floating gate is disposed above a substrate. The floating gate is between the source region and the drain region, but separated from them by an oxide layer. The floating gate may be formed of suitable materials such as polycrystalline silicon ("poly") and/or some other conductive materials. The oxide layer may be formed of silicon dioxide ($SiO_2$) and/or the like. The control gate may be disposed over the floating gate. The control gate and the floating gate may be separated by a thin oxide layer.

In operation, a floating gate is capable of holding a charge and is separated from source and drain regions contained in a substrate by an oxide layer. Each of the memory cells may be electrically charged by injecting electrons from the substrate through the oxide layer. The charge may be removed from the floating gate by tunneling the electrons to the source region or an erase gate during an erase operation. The data in flash memory cells are thus determined by the presence or absence of electrical charges in the floating gates.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely a flash memory device. The embodiments of the disclosure may also be applied, however, to a variety of memory devices. Hereinafter, various embodiments will be explained in detail with reference to the accompanying drawings.

Figure 1:
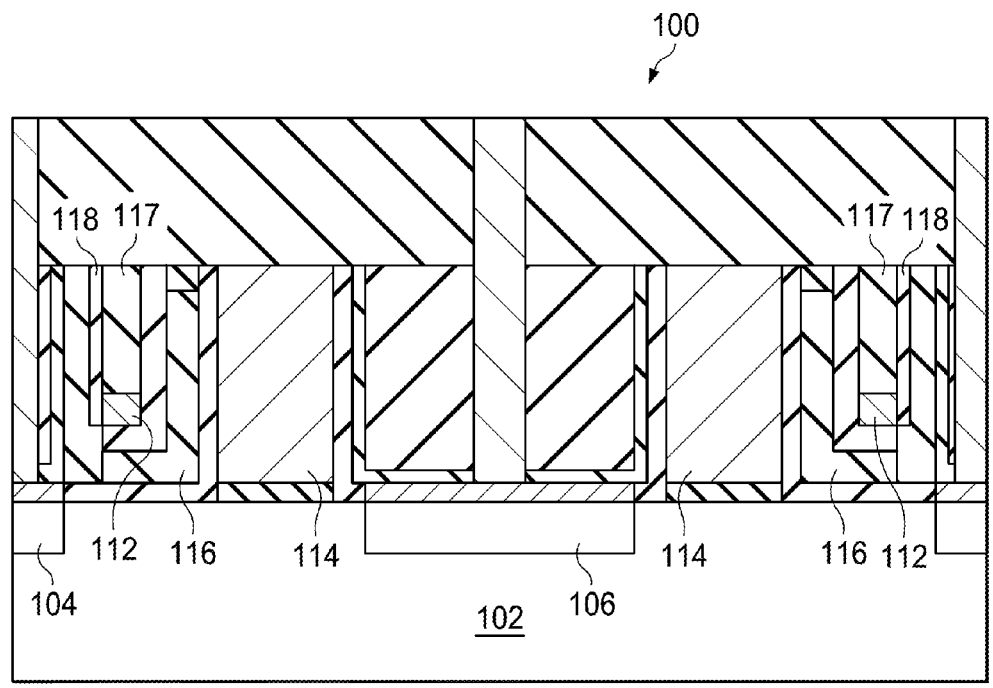
FIG. 1 illustrates a cross sectional view of a memory structure in accordance with various embodiments of the present disclosure.

FIG. 1 illustrates a cross sectional view of a memory structure in accordance with various embodiments of the present disclosure. In some embodiments, the memory structure 100 may be a flash memory cell having a first drain/source region 104 and a second drain/source region 106.

The memory structure 100 comprises a gate structure comprising a control gate 114 and a memory gate 112. Both the control gate 114 and the memory gate 112 are formed over a substrate 102.

The memory structure 100 further comprises a charge storage layer 116. As shown in FIG. 1, the charge storage layer 116 is an L-shaped layer. A horizontal side of the L-shaped layer is formed between the substrate 102 and a horizontal side of the memory gate 112. A vertical side of the L-shaped layer is formed between a vertical side of the memory gate 112 and the control gate 114.

It should be noted that, as shown in FIG. 1, the charge storage layer 116 is enclosed by dielectric materials. As a result, the charge storage layer 116 is isolated from the memory gate 112, the control gate 114 and the substrate 102 respectively.

As shown in FIG. 1, the top surface of the memory gate 112 is protected by a dielectric layer such as a silicon nitride spacer 117 and/or the like. Such a dielectric layer helps to prevent a salicide layer from being formed on top of the memory gate 112. FIG. 1 also illustrates there may be a spacer formed along the sidewall of the memory gate 112. More particularly, a spacer 118 is formed along the sidewall of the memory gate 112 as well as the sidewall of the silicon nitride spacer 117. In some embodiments, the spacer layer 118 helps to protect the memory gate 112 during a silicon dot removal process. The silicon dot removal process will be described below with respect to FIG. 17.

The memory structure 100 may comprise a variety of semiconductor regions. For the purpose of clearly illustrating the inventive aspects of the various embodiments, only a few regions are described in detail herein. The rest of the semiconductor regions of the memory structure 100 will be described below with respect to FIGS. 2-23.

Figure 2:
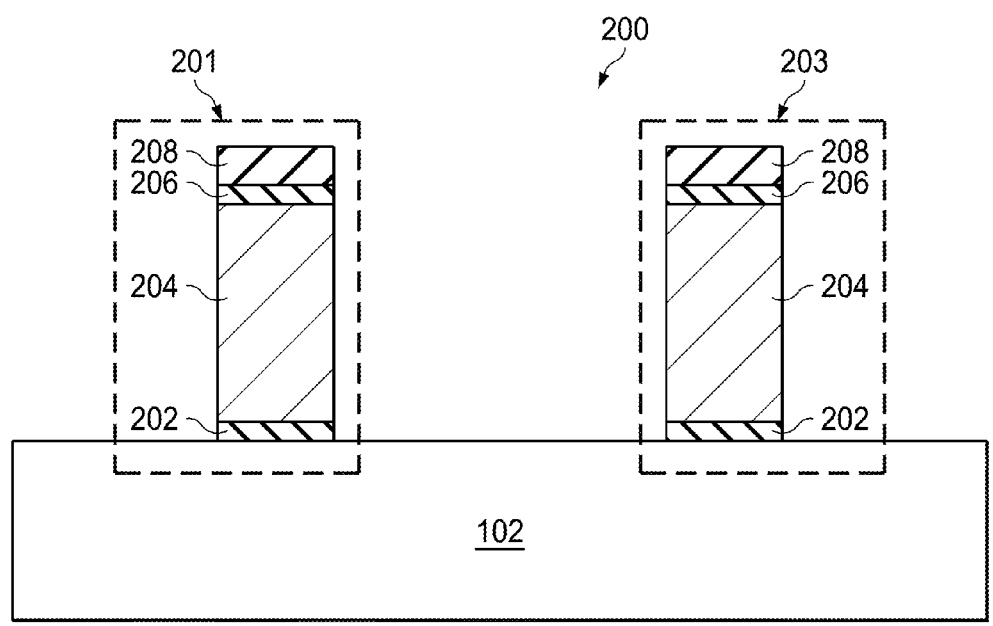
FIG. 2 illustrates a cross sectional view of a semiconductor device having a control gate formed over a substrate in accordance with various embodiments of the present disclosure.

FIGS. 2-23 illustrate intermediate steps of fabricating the memory structure shown in FIG. 1 in accordance with various embodiments of the present disclosure. FIG. 2 illustrates a cross sectional view of a semiconductor device having a control gate formed over a substrate in accordance with various embodiments of the present disclosure. As shown in FIG. 2, a plurality of gate structures 201 and 203 may be formed over the substrate 102. It should be noted while FIG. 2 illustrates two gate structures, the semiconductor device 200 may accommodate any number of gate structures.

The substrate 102 may be formed of silicon, although it may also be formed of other group III, group IV, and/or group V elements, such as silicon, germanium, gallium, arsenic, and combinations thereof. The substrate 102 may also be in the form of bulk substrate or silicon-on-insulator (SOI) substrate.

In forming the gate structures 201 and 203 shown in FIG. 2, a gate dielectric layer 202 is deposited over the substrate 102 and a gate electrode layer such as a poly layer 204 is formed over the gate dielectric layer 202. A hard mask structure including an oxide layer 206 and a nitride layer 208 is formed over the poly layer 204. To form the gate structures 201 and 203 shown in FIG. 2, a photoresist layer (not shown) may be formed over the hard mask structure and a patterning process is applied to the photoresist layer. After an etching process, the gate structures 201 and 203 are formed as shown in FIG. 2.

The gate dielectrics layer 202 may be a dielectric material, such as silicon oxide, silicon oxynitride, silicon nitride, an oxide, a nitrogen-containing oxide, a combination thereof, or the like. The gate dielectrics layer 202 may have a relative permittivity value greater than about 4. Other examples of such materials include aluminum oxide, lanthanum oxide, hafnium oxide, zirconium oxide, hafnium oxynitride, or combinations thereof.

In some embodiments, the gate electrode layer 204 may be formed of poly-silicon. The gate electrode layer 204 may be formed by depositing doped or undoped poly-silicon by low-pressure chemical vapor deposition (LPCVD) to a thickness in the range of about 400 Å to about 2,400 Å, such as about 1,400 Å.

In alternative embodiments, the gate electrode layer 204 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof, or the like.

Figure 3:
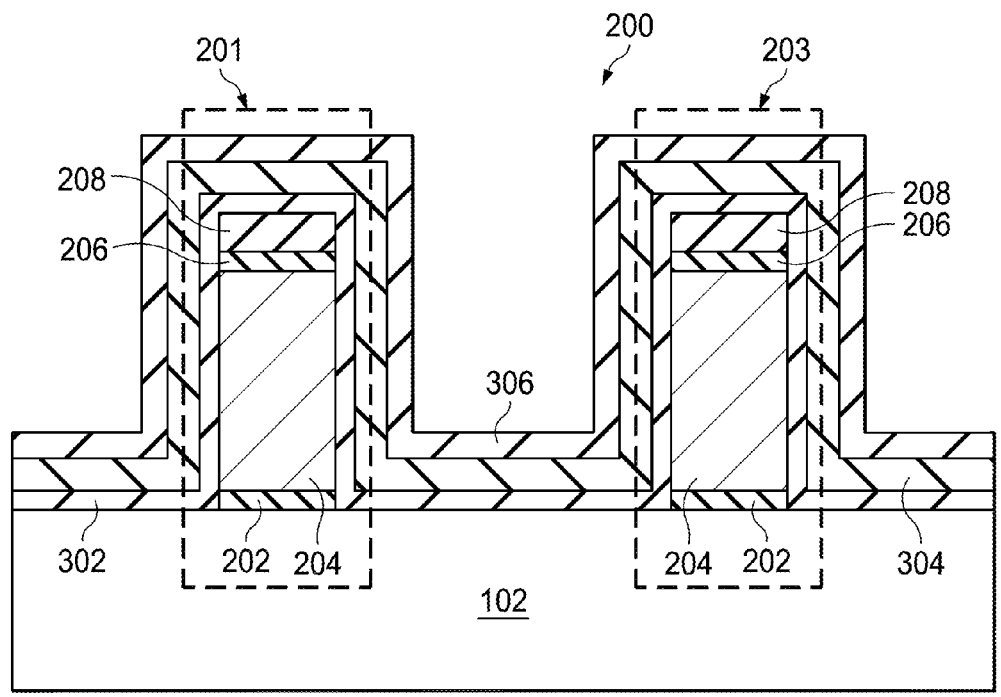
FIG. 3 illustrates a cross sectional view of a semiconductor device shown in FIG. 2 after an O—Si—O structure is formed over the gate structure shown in FIG. 2 in accordance with various embodiments of the present disclosure.

FIG. 3 illustrates a cross sectional view of a semiconductor device shown in FIG. 2 after an oxide-silicon-oxide (O—Si—O) structure is formed over the gate structure shown in FIG. 2 in accordance with various embodiments of the present disclosure. The O—Si—O structure includes a first oxide layer 302, a silicon dot layer 304 and a second oxide layer 306. As shown in FIG. 3, the first oxide layer 302 is deposited over the top surface of the substrate 102, the sidewalls of the gate structures and the top surfaces of the gate structures. In some embodiments, the first oxide layer 302 is of a thickness of about 50 Å.

The silicon dot layer 304 is formed over the first oxide layer 302. In some embodiments, the silicon dot layer 304 is of a thickness of about 100 Å. The silicon dot layer 304 may be formed by using suitable deposition techniques such as LPCVD, plasma enhanced chemical vapor deposition (PECVD) and/or the like. The semiconductor device 200 may be placed into a low pressure furnace (not shown). The reactive gases of the deposition process may include SiH4 and/or the like. The reactive gases may be mixed with a carrier gas such as N2, Ar and/or the like.

In some embodiments, the silicon dot formation process is of a temperature in a range from about 400 degrees to about 800 degrees. The flow rate of the reactive gases is in a range from about 5 Standard Liter per Minute (SLM) to about 20 SLM. The pressure of the silicon dot formation process is in a range from about 5 Torr to about 20 Torr.

As shown in FIG. 3, the second oxide layer 306 is deposited over the top surface of the silicon dot layer 304 through suitable semiconductor deposition techniques. In some embodiments, the second oxide layer 306 is of a thickness of about 100 Å.

Figure 4:
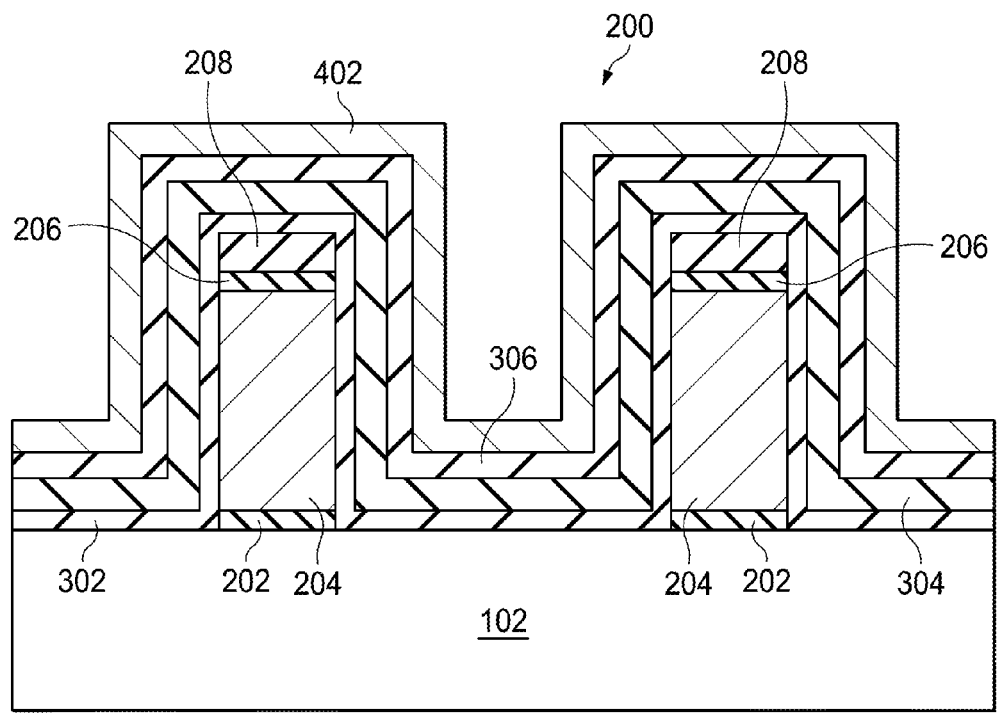
FIG. 4 illustrates a cross sectional view of the semiconductor device shown in FIG. 3 after a memory gate electrode layer is deposited over the substrate in accordance with various embodiments of the present disclosure.

FIG. 4 illustrates a cross sectional view of the semiconductor device shown in FIG. 3 after a memory gate electrode layer is deposited over the substrate in accordance with various embodiments of the present disclosure. The memory gate electrode layer 402 may be formed of suitable materials such as poly-silicon. The memory gate electrode layer 402 is deposited over the semiconductor device 200 using suitable deposition techniques such as chemical vapor deposition (CVD) and/or the like.

As shown in FIG. 4, the memory gate electrode layer 402 may conform to the underlying topographic features such as the shape of the silicon dot layer 304. In other words, the memory gate electrode layer 402 is a conformal layer deposited on the semiconductor device 200.

Figure 5:
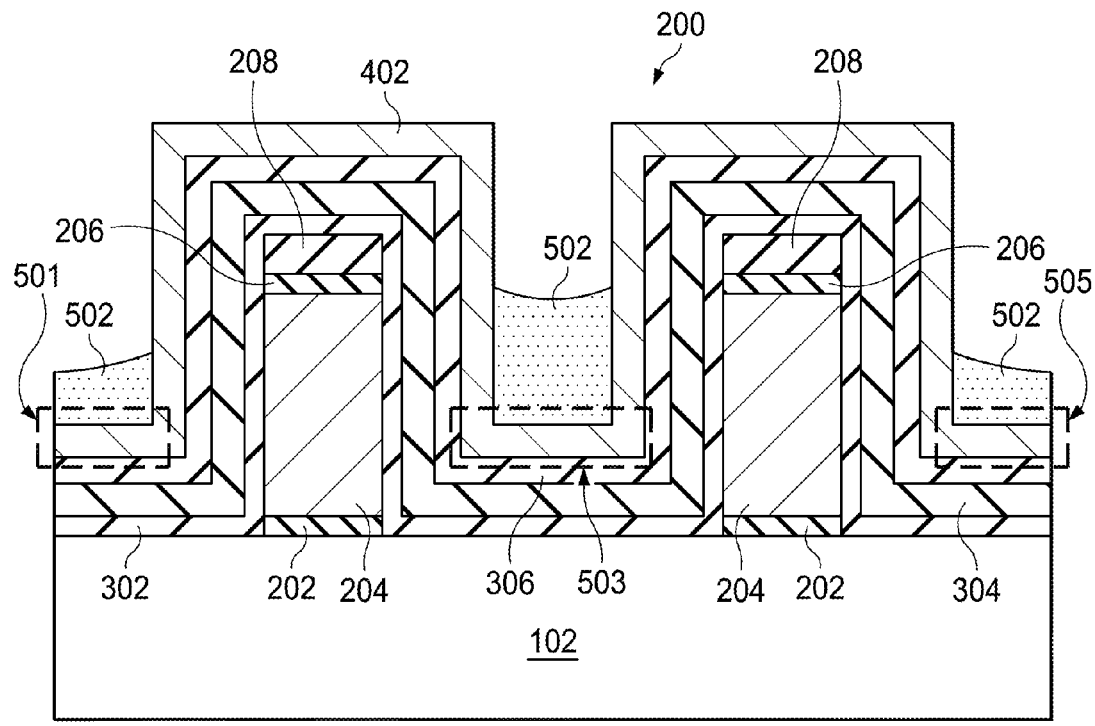
FIG. 5 illustrates a cross sectional view of the semiconductor device shown in FIG. 4 after a BARC layer is deposited over the substrate in accordance with various embodiments of the present disclosure.

FIG. 5 illustrates a cross sectional view of the semiconductor device shown in FIG. 4 after a bottom anti-reflection coating (BARC) layer is deposited over the substrate in accordance with various embodiments of the present disclosure. The BARC layer 502 is formed over the memory gate electrode layer 402. As shown in FIG. 5, the BARC layer 502 is formed over the bottom sides 501, 503 and 505 of the memory gate electrode layer 402. In particular, the BARC layer 502 partially fills the gap between two adjacent control gate structures.

In some embodiments, the BARC layer 502 may function as a gate dimension controlling layer. In particular, the thickness of the BARC layer 502 is predetermined based upon the height of the memory gate 112 (not shown but illustrated in FIG. 1). The relationship between the thickness of the BARC layer 502 and the dimension of the memory gate 112 will be described below with respect to FIG. 6.

The BARC layer 502 may be formed of a nitride material, an organic material, an oxide material and the like. The BARC layer 502 may be formed using suitable techniques such as CVD and/or the like.

Figure 6:
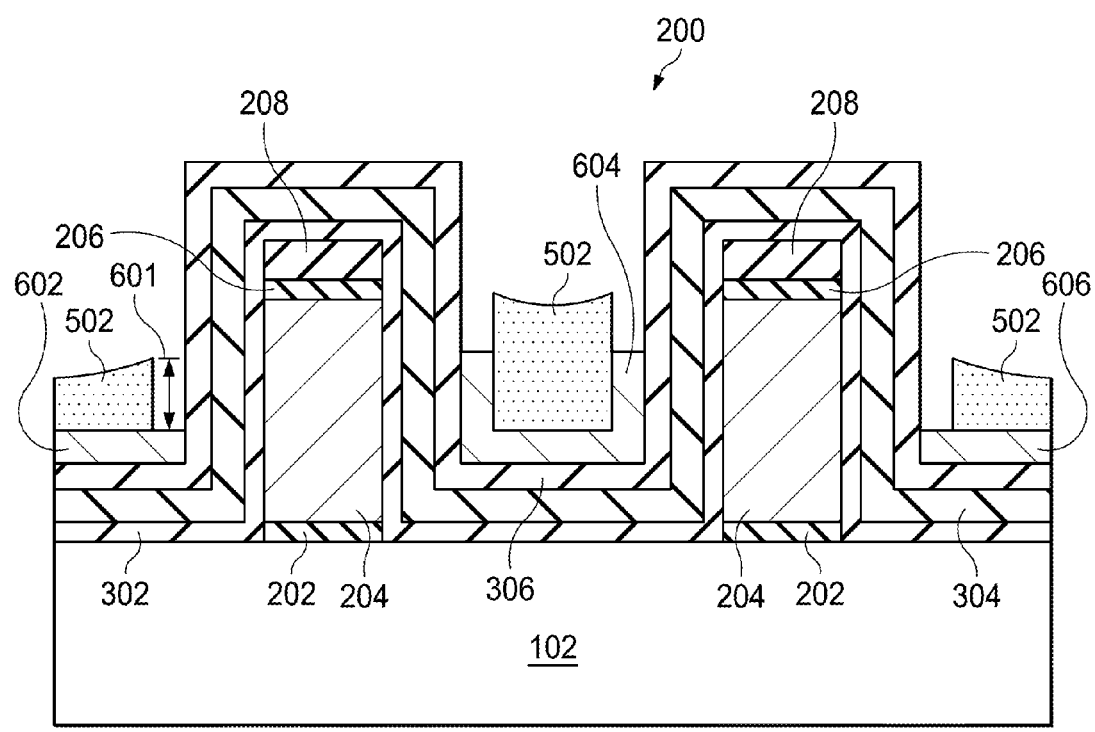
FIG. 6 illustrates a cross sectional view of the semiconductor device shown in FIG. 5 after an etch-back process is applied to the memory gate electrode layer in accordance with various embodiments of the present disclosure.

FIG. 6 illustrates a cross sectional view of the semiconductor device shown in FIG. 5 after an etch-back process is applied to the memory gate electrode layer in accordance with various embodiments of the present disclosure. An etch-back process may be used to remove the upper portion of the memory gate electrode layer 402 (not shown but illustrated in FIG. 5) to form the remaining memory gate electrode layers 602, 604 and 606 as shown in FIG. 6.

As shown in FIG. 6, there may be a gap 601 between the top surface of the remaining memory gate electrode layer 602 and the top surface of the BARC layer 502. By controlling the strength of the etch-back process, the gap 601 may be controlled accordingly. In some embodiments, the gap 601 is about 100 angstroms.

In some embodiments, the thickness of the remaining memory electrode layer (e.g., memory gate electrode layer 602) is approximately equal to the height of the memory gate 112 shown in FIG. 1. As such, the dimension such as the height of the memory gate 112 can be controlled through controlling the thickness of the BARC layer 502.

One advantageous feature of having controllable dimensions of a memory gate (e.g., height and/or width of the memory gate 112) is that the electrical characteristics of the semiconductor device 200 may be improved through tight and precise control of the dimensions of the memory gate of the semiconductor device 200. For example, a precise and tight control of the dimensions of the memory gate 112 helps to balance between the disturb performance of a flash cell and the erase threshold voltage (Vt).

Figure 7:
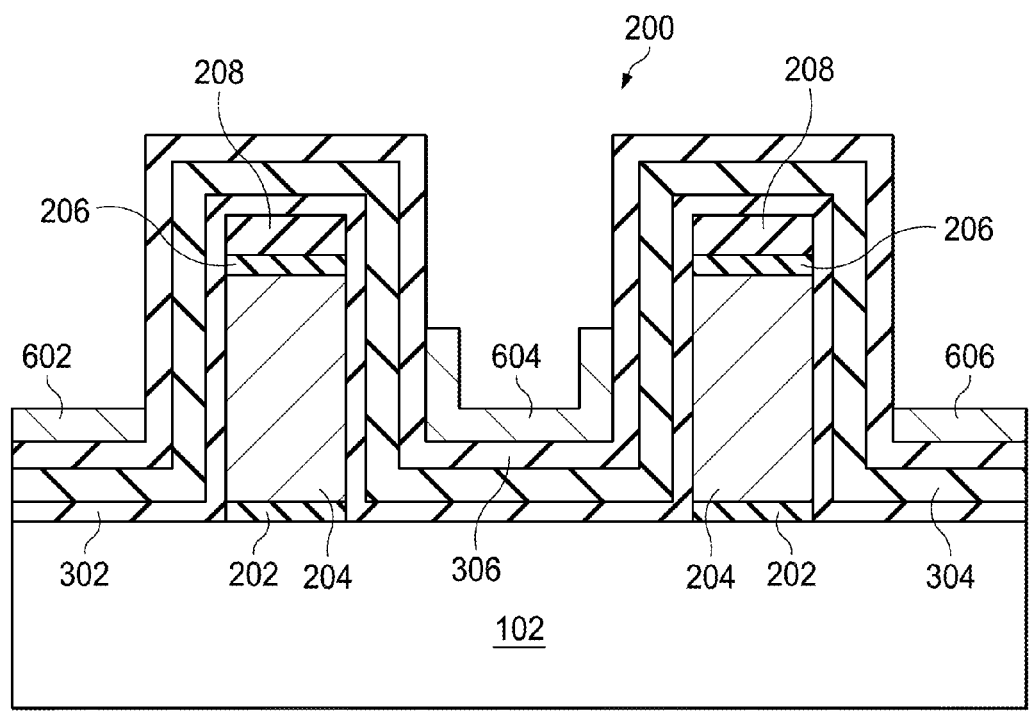
FIG. 7 illustrates a cross sectional view of the semiconductor device shown in FIG. 6 after a BARC removal process is applied to the semiconductor device in accordance with various embodiments of the present disclosure.

FIG. 7 illustrates a cross sectional view of the semiconductor device shown in FIG. 6 after a BARC removal process is applied to the semiconductor device in accordance with various embodiments of the present disclosure. A BARC removal process may be applied to the semiconductor device after the etching process finishes. The BARC layer 502 may be removed by using suitable etching techniques including dry etching, wet etching, a combination thereof and/or the like.

Figure 8:
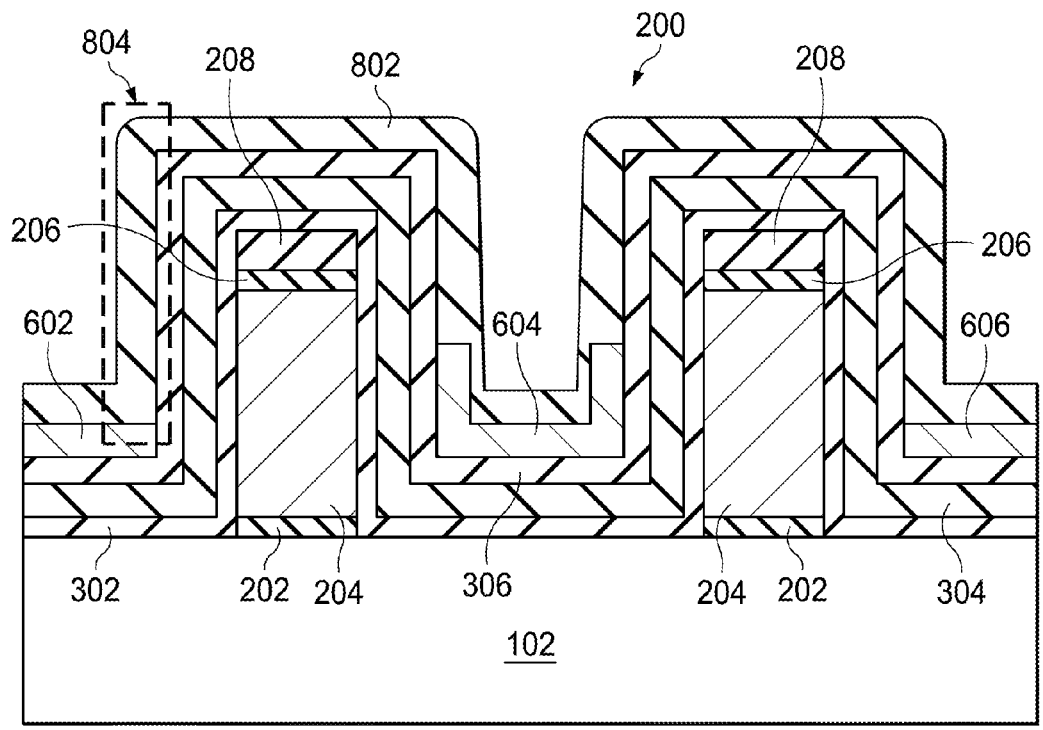
FIG. 8 illustrates a cross sectional view of the semiconductor device shown in FIG. 7 after a memory gate spacer layer is deposited over the semiconductor device in accordance with various embodiments of the present disclosure.

FIG. 8 illustrates a cross sectional view of the semiconductor device shown in FIG. 7 after a memory gate spacer layer is deposited over the semiconductor device in accordance with various embodiments of the present disclosure. In some embodiments, the memory gate spacer layer 802 may be formed of suitable materials such as silicon nitride and/or the like. The memory gate spacer layer 802 may be deposited over the memory gate electrode layers as well as the second oxide layer 306 through suitable semiconductor deposition techniques.

It should be noted that the thickness of the memory gate spacer layer 802 may determine the critical dimensions such as the width of the memory gate 112 (not shown but illustrate in FIG. 1). In particular, the thickness of the sidewall portion 804 of the memory gate spacer layer 802 may determine the shape of the memory gate 112. The detailed fabrication process and the resulting shape of the memory gate structure will be described below with respect to FIG. 9.

Figure 9:
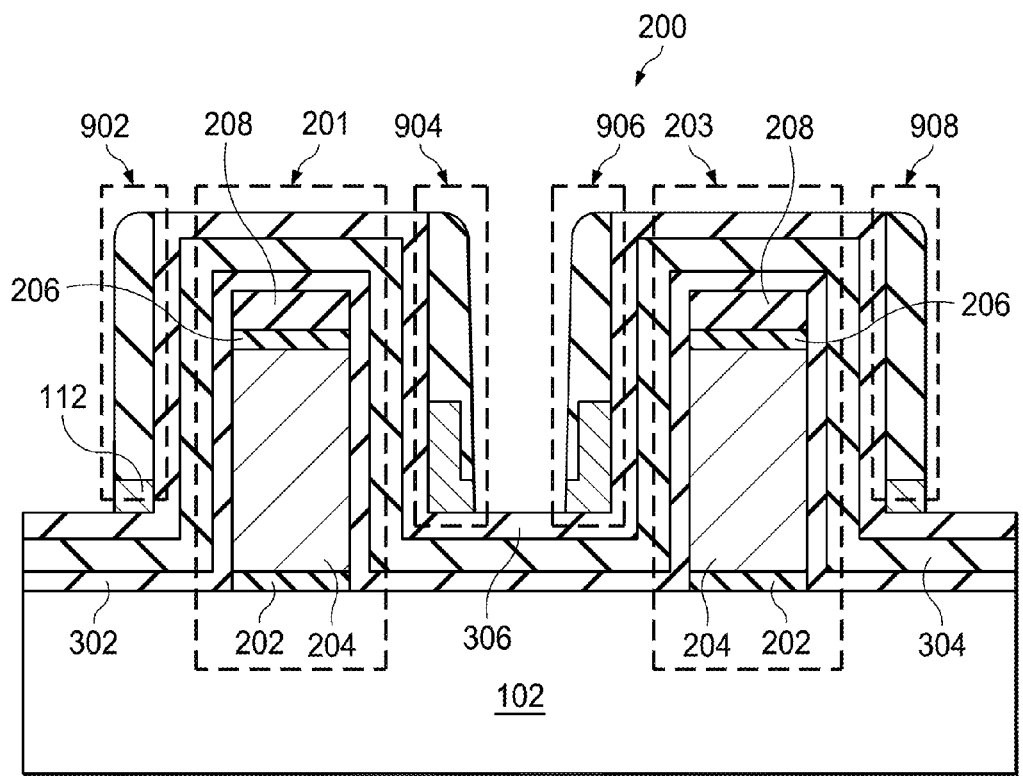
FIG. 9 illustrates a cross sectional view of the semiconductor device shown in FIG. 8 after an etching process is applied to the semiconductor device in accordance with various embodiments of the present disclosure.

FIG. 9 illustrates a cross sectional view of the semiconductor device shown in FIG. 8 after an etching process is applied to the semiconductor device in accordance with various embodiments of the present disclosure. An etching process is applied to the semiconductor device 200. By controlling the strength and direction of the etching process, portions of the remaining memory gate electrode layers and the memory gate spacer layer 802 have been removed as a result. As shown in FIG. 9, the etching process stops on the top surface of the second oxide layer 306.

As shown in FIG. 9, after the etching process finishes, there may be four resulting memory gate structures, namely a first memory gate structure 902, a second memory gate structure 904, a third memory gate structure 906 and a fourth memory gate structure 908. As shown in FIG. 9, the first memory gate structure 902 and the second memory gate structure 904 are formed along sidewalls of the first control gate structure 201. The third memory gate structure 906 and the fourth memory gate structure 908 are formed along sidewalls of the second control gate structure 203.

It should be noted that the etching process described above is a self-aligned memory gate etching process because the critical dimensions of the resulting memory gate structures are determined by the shape of the memory gate spacer layer 802. As shown in FIG. 9, the portion of memory gate electrode layer 602 (shown in FIG. 8) underneath the horizontal side of the memory gate spacer layer 802 has been removed. As a result, the remaining portion of the memory gate electrode layer is the memory gate 112. In some embodiments, the width of the memory gate 112 is determined by the thickness of the sidewall portion of the memory gate spacer layer 802.

Figure 10:
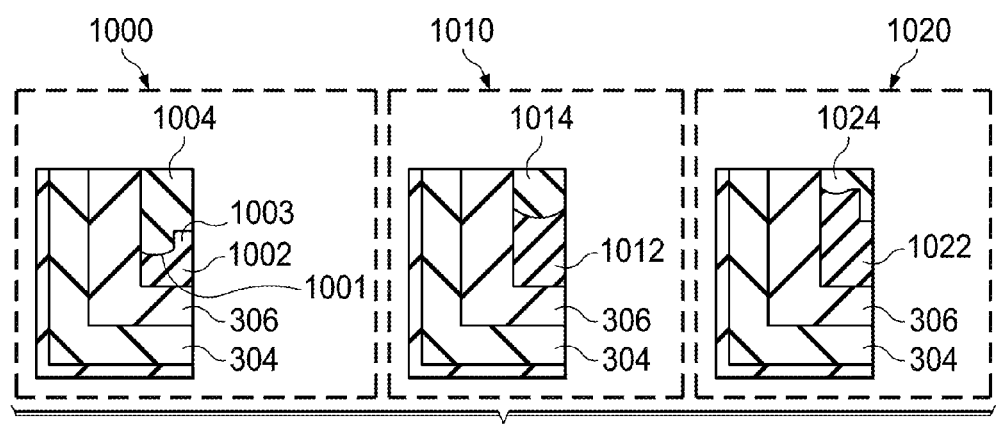
FIG. 10 shows three illustrative memory gate profiles in accordance with various embodiments of the present disclosure.

FIG. 10 shows three illustrative memory gate profiles in accordance with various embodiments of the present disclosure. A first memory gate profile 1000 shows a memory gate 1002 is formed over the second oxide layer 306 as well as the silicon dot layer 304. A memory gate spacer layer 1004 is formed over the memory gate 1002. The memory gate spacer layer 1004 is formed of suitable materials such as silicon nitride and/or the like. The formation process of the memory gate 1002 is similar to the memory gate 112 shown in FIG. 9.

The top surface of the memory gate 1002 can be divided into an outer region 1003 and an inner region 1001. In some embodiments, the outer region 1003 has a flat surface. The top surface of the outer region 1003 is about 50 Å higher than the top surface of the inner region 1001.

A second memory gate profile 1010 is of a structure similar to that of the first memory gate profile 1000 except that the surface of the inner region of the second memory gate profile 1010 is approximately level with the surface of the outer region.

A third memory gate profile 1020 is of a structure similar to that of the first memory gate profile 1000 except that the surface of the inner region of the third memory gate profile 1020 is about 50 Å higher than the surface of the outer region.

Figure 11:
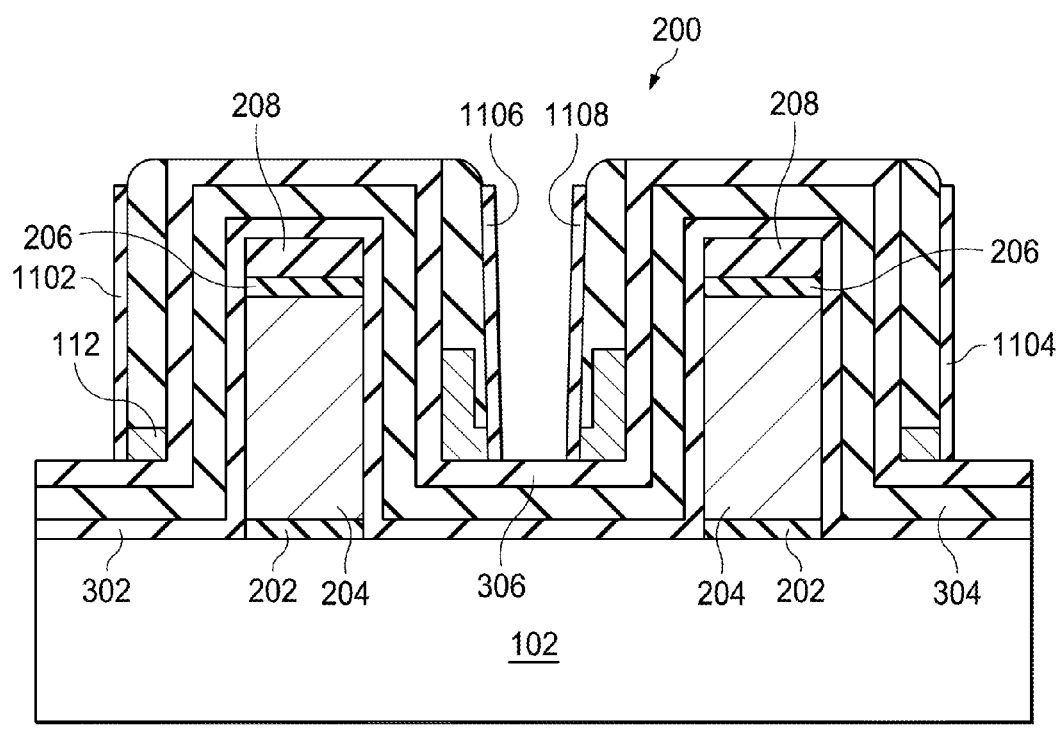
FIG. 11 illustrates a cross sectional view of the semiconductor device shown in FIG. 9 after a plurality of spacers are formed over their respective memory gate structures in accordance with various embodiments of the present disclosure.

FIG. 11 illustrates a cross sectional view of the semiconductor device shown in FIG. 9 after a plurality of spacers are formed over their respective memory gate structures in accordance with various embodiments of the present disclosure. A spacer layer (not shown) may be formed by blanket depositing one or more spacer layers (not shown) over the semiconductor device 200. The spacer layer may comprise SiN, oxynitride, SiC, SiON, oxide, and the like and may be formed by commonly used methods such as CVD, PECVD, sputter, and other methods known in the art. The spacer layer may be patterned, such as by isotropically or anisotropically etching, thereby removing the spacer layer from the horizontal surfaces of the structure and forming the spacers 1102 and 1104 as illustrated in FIG. 11.

Figure 12:
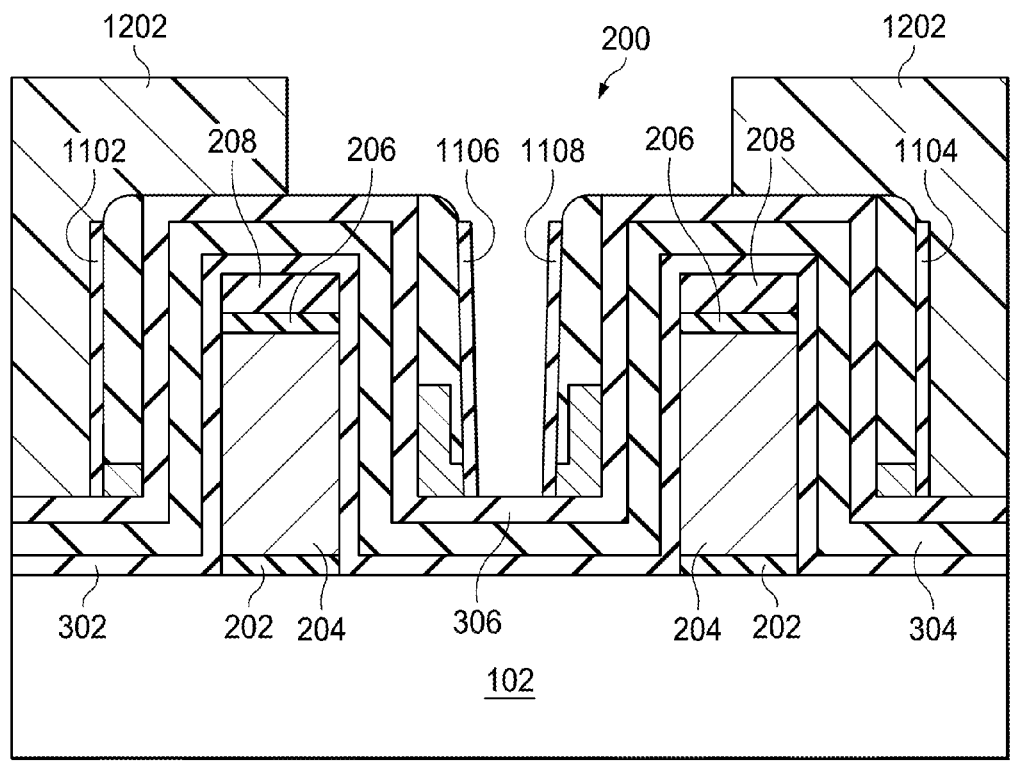
FIG. 12 illustrates a cross sectional view of the semiconductor device shown in FIG. 11 after a patterning process is applied to a photoresist layer in accordance with various embodiments of the present disclosure.

FIG. 12 illustrates a cross sectional view of the semiconductor device shown in FIG. 11 after a patterning process is applied to a photoresist layer in accordance with various embodiments of the present disclosure. The opening of a drain/source region of the semiconductor device 200 may be formed by using photolithography techniques to deposit and pattern a photoresist layer 1202. A portion of the photoresist layer 1202 is exposed according to the location and shape of the drain/source region. The removal of a portion of the photoresist layer 1202 involves lithography operations, which are well known, and hence are not discussed in further detail herein.

Figure 13:
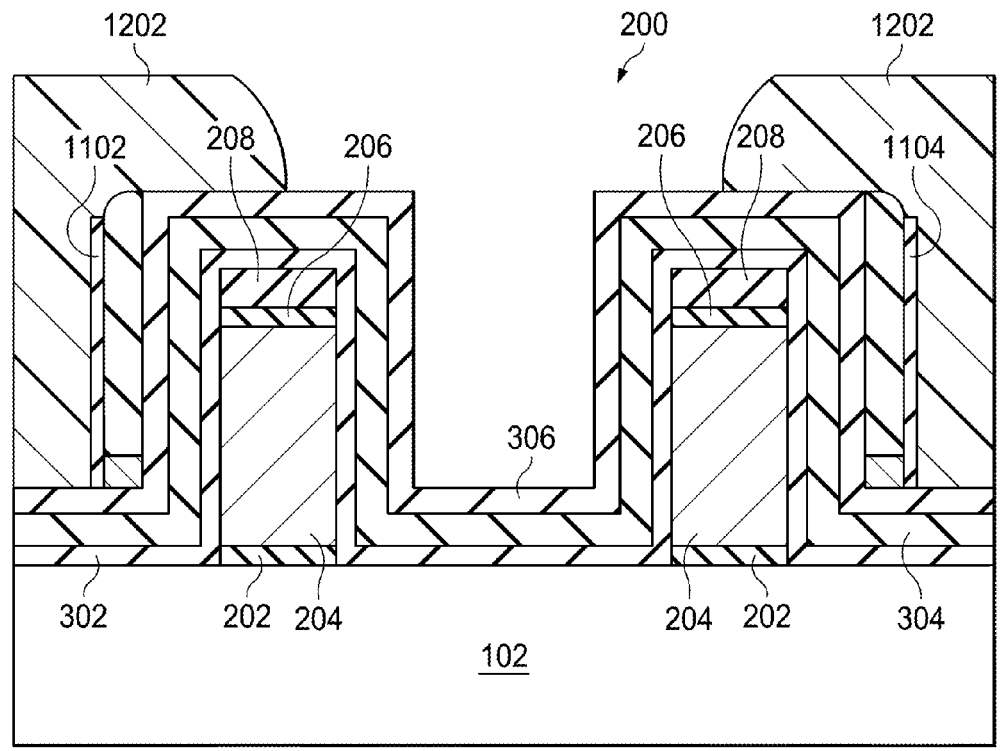
FIG. 13 illustrates a cross sectional view of the semiconductor device shown in FIG. 12 after an etching process is applied to the semiconductor device in accordance with various embodiments of the present disclosure.

FIG. 13 illustrates a cross sectional view of the semiconductor device shown in FIG. 12 after an etching process is applied to the semiconductor device in accordance with various embodiments of the present disclosure. A suitable etching process such as an isotropic dry-etch process (a.k.a. CDE) may be applied to the exposed drain/source region of the semiconductor device 200. By controlling the strength and direction of the etching process, the second memory gate structure 904 and the third memory gate structure 906 (now shown but illustrated in FIG. 9) have been removed. The etching process stops on the top surface of the second oxide layer 306.

Figure 14:
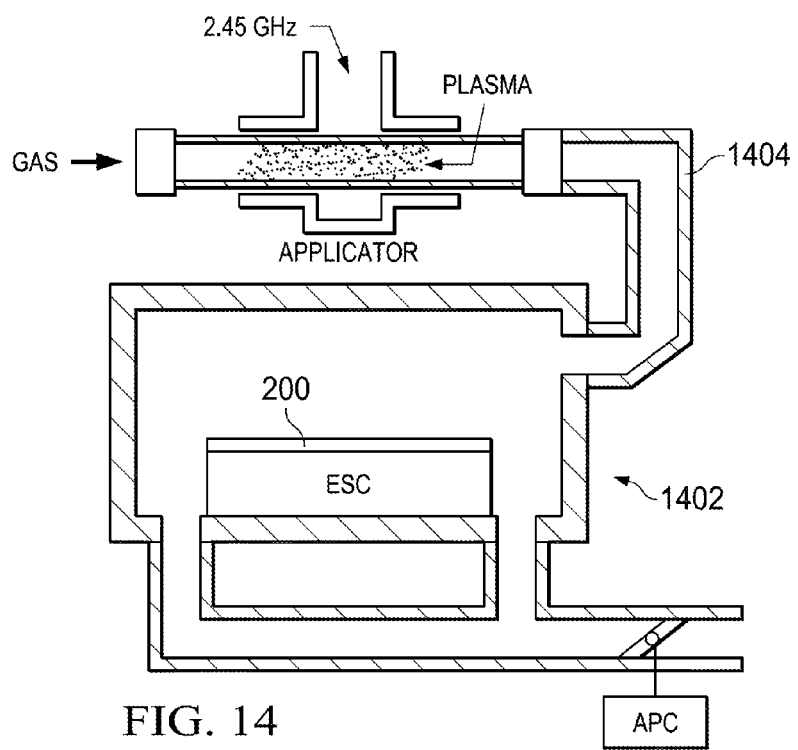
FIG. 14 illustrates a simplified diagram of the chamber of the isotropic dry etch process in accordance with various embodiments of the present disclosure.

FIG. 14 illustrates a simplified diagram of the chamber of the isotropic dry-etch process in accordance with various embodiments of the present disclosure. The semiconductor device 200 may be placed on an electrostatic chuck (ESC) inside the chamber 1402. In order to prevent the plasma source of the etching process from damaging the semiconductor device 200, the plasma source is placed outside the chamber 1402 as shown in FIG. 14. The reactive gas of the dry etching process is fed into the chamber 1402 through a tube 1404.

In some embodiments, the active species of the dry etching process are generated in a location away from the chamber 1402 and transported into the chamber 1402 through the tube 1404. The etching process is implemented as a down-flow etching process. Such a down-flow etching process helps to improve the uniformity of the surface of the semiconductor device 200. The ESC shown in FIG. 14 is capable of adjusting the temperature of the semiconductor device 200 so that the semiconductor device 200 is of a stable temperature during the etching process. Moreover, an automatic pressure controller (APC) is employed to maintain a stable pressure level in the chamber 1402.

The reactive gases of the dry etching process include a mixture of a first gas and a second gas. The first gas may be any CxHyFz type etching gases such as $CF_4$, $CH_2F_2$, $CHF_3$, any combination thereof and/or the like. The second gas may be oxygen. In some embodiments, the ratio of the first gas to the second gas is in a range from about 0.5 to about 1.5. The etching process pressure is in a range from about 200 mT to about 500 mT. The flow rate of the reactive gases is in a range from about 300 Standard Cubic Centimeters per Minute (SCCM) to about 800 SCCM. The etching selectivity of silicon/oxide is maintained in a range from about 5 to about 10. Likewise, the etching selectivity of nitride/oxide is maintained in a range from about 5 to about 10.

Figure 15:
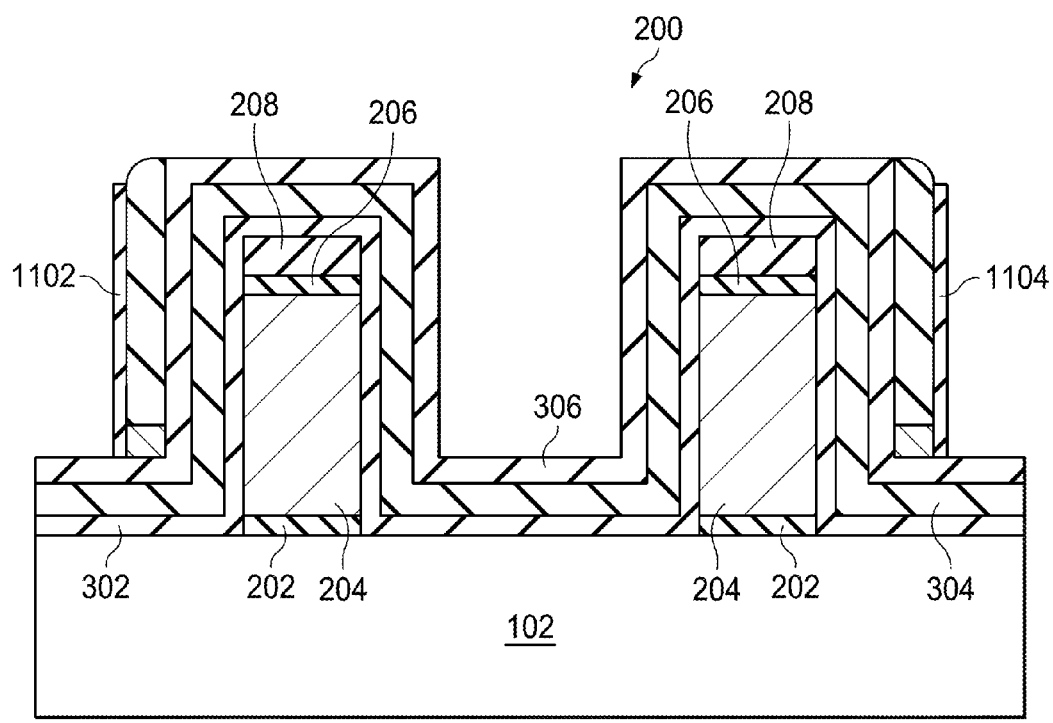
FIG. 15 illustrates a cross sectional view of the semiconductor device shown in FIG. 13 after a photoresist removal process is applied to the remaining photoresist layer in accordance with various embodiments of the present disclosure.

FIG. 15 illustrates a cross sectional view of the semiconductor device shown in FIG. 13 after a photoresist removal process is applied to the remaining photoresist layer in accordance with various embodiments of the present disclosure. The remaining photoresist layer shown in FIG. 13 may be removed by using suitable photoresist stripping techniques such as chemical solvent cleaning, plasma ashing, dry stripping and/or the like. The photoresist stripping techniques are well known and hence are not discussed in further detail herein to avoid repetition.

Figure 16:
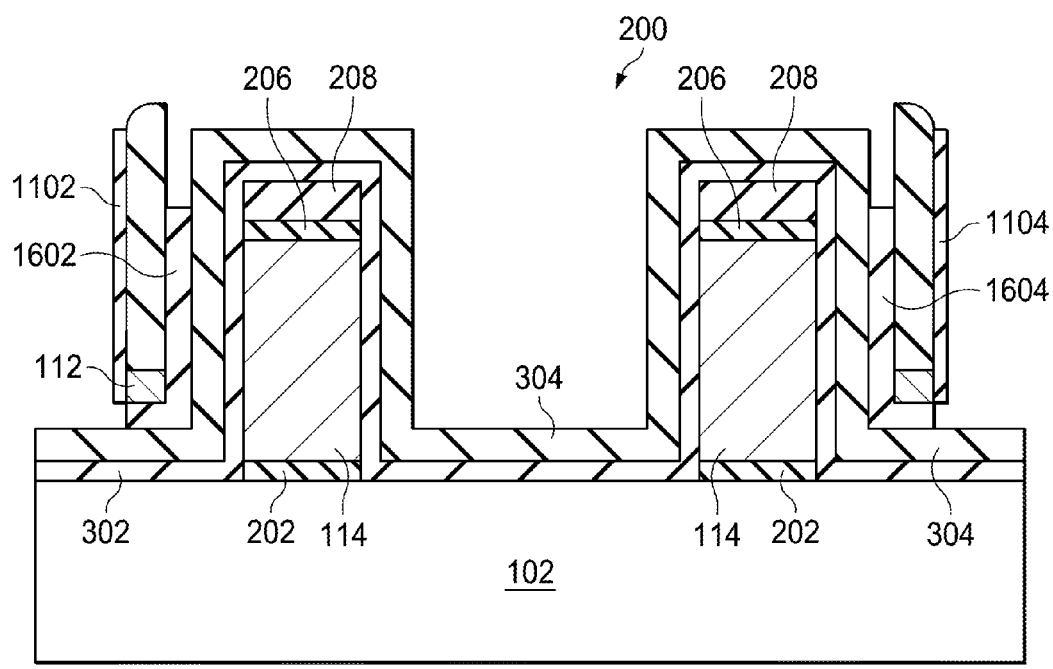
FIG. 16 illustrates a cross sectional view of the semiconductor device shown in FIG. 15 after an etching process is applied to the second oxide layer in accordance with various embodiments of the present disclosure.

FIG. 16 illustrates a cross sectional view of the semiconductor device shown in FIG. 15 after an etching process is applied to the second oxide layer in accordance with various embodiments of the present disclosure. An etching process such as a wet etching process is applied to the second oxide layer 306 (not shown but illustrated in FIG. 15). As shown in FIG. 16, a majority of the second oxide layer 306 has been removed as a result. The remaining portion of the second oxide layer 306 includes two L-shaped structures 1602 and 1604 situated between the memory gates (e.g., the memory gate 112) and their respective control gates (e.g., the control gate 114).

Figure 17:
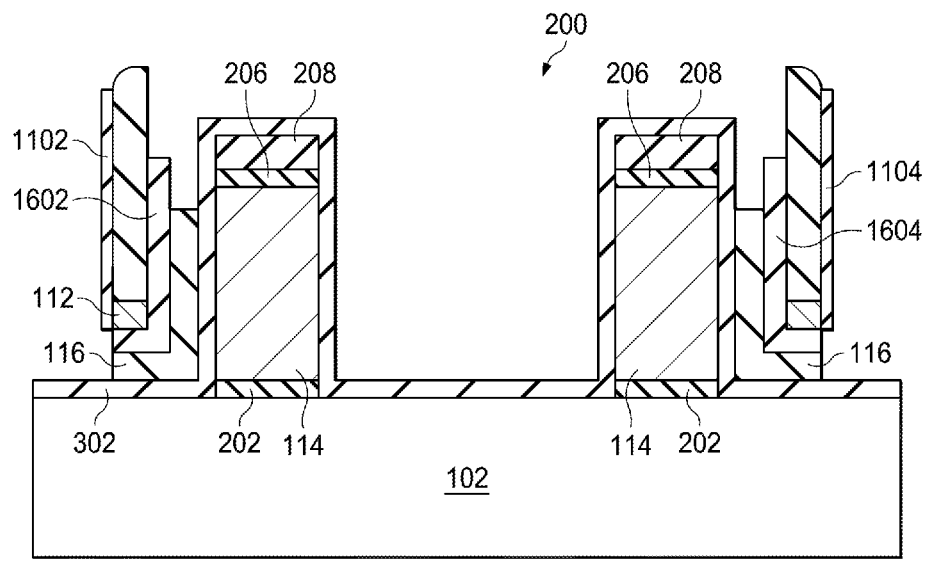
FIG. 17 illustrates a cross sectional view of the semiconductor device shown in FIG. 16 after an etching process is applied to the semiconductor device in accordance with various embodiments of the present disclosure.

FIG. 17 illustrates a cross sectional view of the semiconductor device shown in FIG. 16 after an etching process is applied to the semiconductor device in accordance with various embodiments of the present disclosure. A suitable etching process such as an isotropic dry etch process is applied to the exposed portions of the silicon dot layer 304 (shown in FIG. 16). As a result, a majority of the silicon dot layer 304 has been removed to form the charge storage layer 116. The spacer 1102 prevents the memory gate 112 from being recessed. The isotropic dry etch process has been described above with respect to FIG. 13 and FIG. 14, and hence is not discussed again to avoid unnecessary repetition.

As shown in FIG. 17, the remaining silicon dot layer 304 may include an L-shaped layer. The L-shaped layer may function as a charge storage layer for the semiconductor device 200. The silicon nitride layer over the memory gate 112 may function as a protective layer. Such a protective layer helps to prevent salicide formation on top of the memory gate 112.

Figure 18:
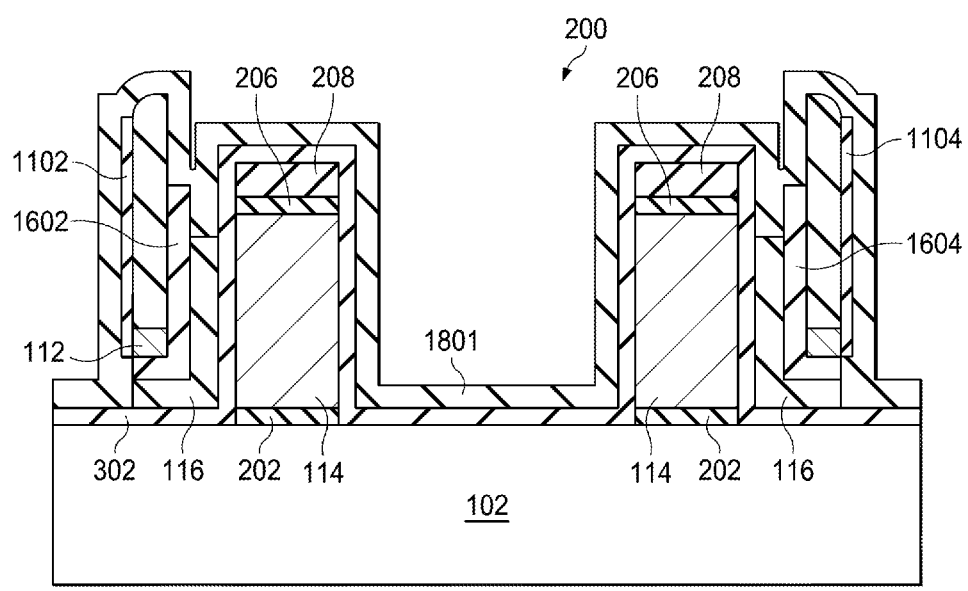
FIG. 18 illustrates a cross section view of the semiconductor device shown in FIG. 17 after a spacer deposition is applied to the semiconductor device in accordance with various embodiments of the present disclosure.

FIG. 18 illustrates a cross section view of the semiconductor device shown in FIG. 17 after a spacer deposition is applied to the semiconductor device in accordance with various embodiments of the present disclosure. A spacer layer (not shown) may be formed by blanket depositing one or more spacer layers (not shown) over the semiconductor device 200. The spacer layer 1801 may comprise SiN, RPO and/or the like and may be formed by commonly used methods such as CVD, PECVD, sputter, and other methods known in the art. It should be noted that the top surface of the memory gate 112 is covered by a spacer layer as shown in FIG. 18. Such a spacer layer helps to prevent a salicide layer from being formed over the memory gate 112.

Figure 19:
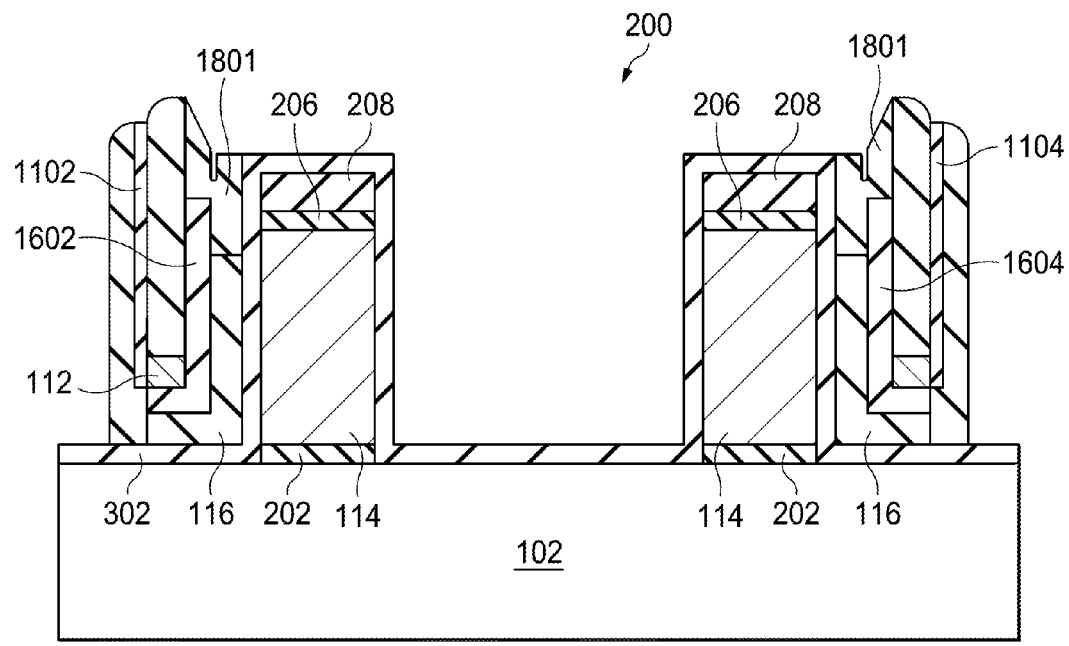
FIG. 19 illustrates a cross section view of the semiconductor device shown in FIG. 18 after an etching process is applied to the semiconductor device in accordance with various embodiments of the present disclosure.

FIG. 19 illustrates a cross section view of the semiconductor device shown in FIG. 18 after an etching process is applied to the semiconductor device in accordance with various embodiments of the present disclosure. The spacer layer 1801 may be patterned, such as by isotropically or anisotropically etching, thereby removing the spacer layer over the drain/source regions as shown in FIG. 19.

Figure 20:
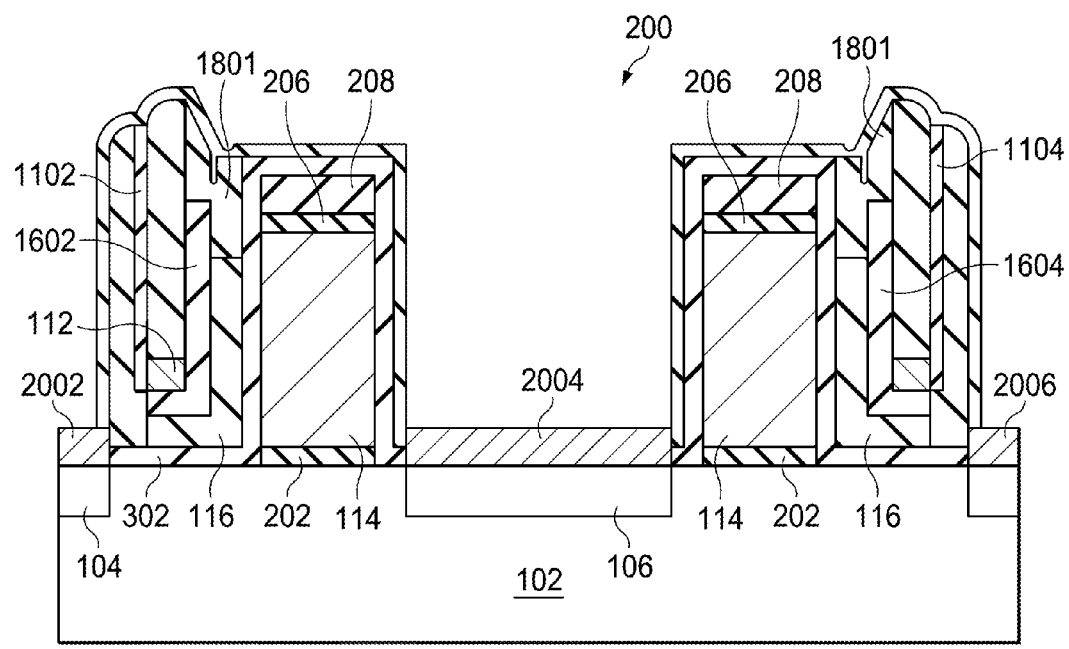
FIG. 20 illustrates a cross section view of the semiconductor device shown in FIG. 19 after an ion implantation process is applied to the semiconductor device in accordance with various embodiments of the present disclosure.

FIG. 20 illustrates a cross section view of the semiconductor device shown in FIG. 19 after an ion implantation process is applied to the semiconductor device in accordance with various embodiments of the present disclosure. The drain/source regions 104 and 106 may be formed through an ion implantation process. As is known to those of skill in the art, the use of dopant atoms in an implant step may form the drain/source regions 104 and 106 with a particular conductivity type. Depending on different applications, the drain/source regions 104 and 106 may be n-type or p-type.

In some embodiments, the drain/source regions 104 and 106 may be a p-type region. Appropriate p-type dopants such as boron, gallium, indium and/or the like are implanted into the substrate 102 to form the drain/source regions 104 and 106. Alternatively, the drain/source regions 104 and 106 may be an n-type region. Appropriate n-type dopants such as phosphorous, arsenic and/or the like are implanted into the substrate 102 to form the drain/source regions 104 and 106.

FIG. 20 further illustrates a cross sectional view of the semiconductor device shown in FIG. 19 after silicide regions are formed over the drain/source regions 104 and 106. The silicide regions 2002, 2004 and 2006 are formed by a salicide process. In a salicide process, a thin layer of metal is blanket deposited over a semiconductor wafer having exposed drain/source regions. The wafer is then subjected to one or more annealing steps. This annealing process causes the metal to selectively react with the exposed silicon of the source/drain regions, thereby forming metal silicide regions 2002, 2004 and 2006 over the drain/source regions. The process is referred to as a self-aligned silicidation process because the silicide layer is formed only where the metal material directly contacts the silicon drain/source regions and the gate electrodes.

In some embodiments, silicide regions 2002, 2004 and 2006 comprise metals that react with silicon such as titanium, platinum, cobalt and the like. However, other metals, such as manganese, palladium and the like, can also be used.

Figure 21:
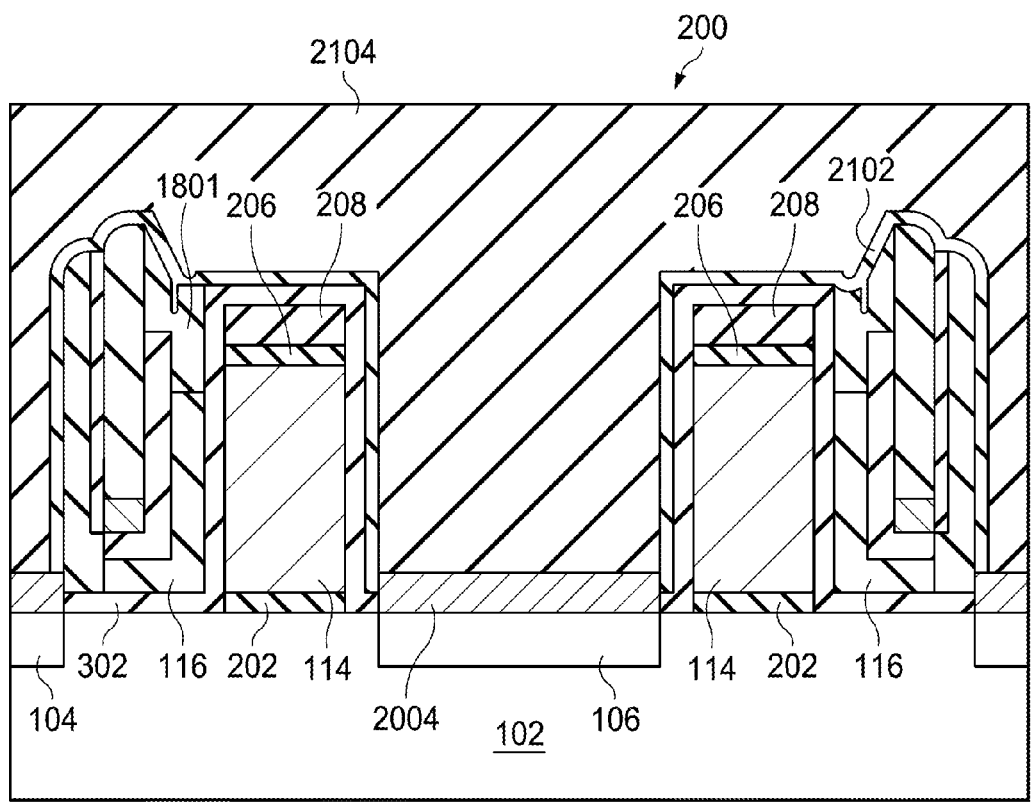
FIG. 21 illustrates a cross sectional view of the semiconductor device shown in FIG. 20 after a contact etch stop layer (CESL) is formed on the semiconductor device in accordance with various embodiments of the present disclosure.

FIG. 21 illustrates a cross sectional view of the semiconductor device shown in FIG. 20 after a contact etch stop layer (CESL) is formed on the semiconductor device in accordance with various embodiments of the present disclosure. The CESL 2102 may comprise commonly used dielectric materials, such as silicon nitride, silicon oxynitride, silicon oxycarbide, silicon carbide, combinations thereof, and multi-layers thereof. The CESL 2102 is deposited over the semiconductor device through suitable deposition techniques such as sputtering, CVD and the like.

An inter-layer dielectric (ILD) layer 2104 may be formed over the CESL 2102. The ILD layer 2104 may be formed by chemical vapor deposition, sputtering, or any other methods known and used in the art for forming an ILD, using, e.g., tetra-ethyl-ortho-silicate (TEOS) and oxygen as a precursor. The ILD layer 2104 may be about 4,000 Å to about 13,000 Å in thickness, but other thicknesses may be used. The ILD layer 2104 may comprise doped or undoped silicon oxide, although other materials such as silicon nitride doped silicate glass, high-k materials, combinations of these, or the like, may alternatively be utilized.

Figure 22:
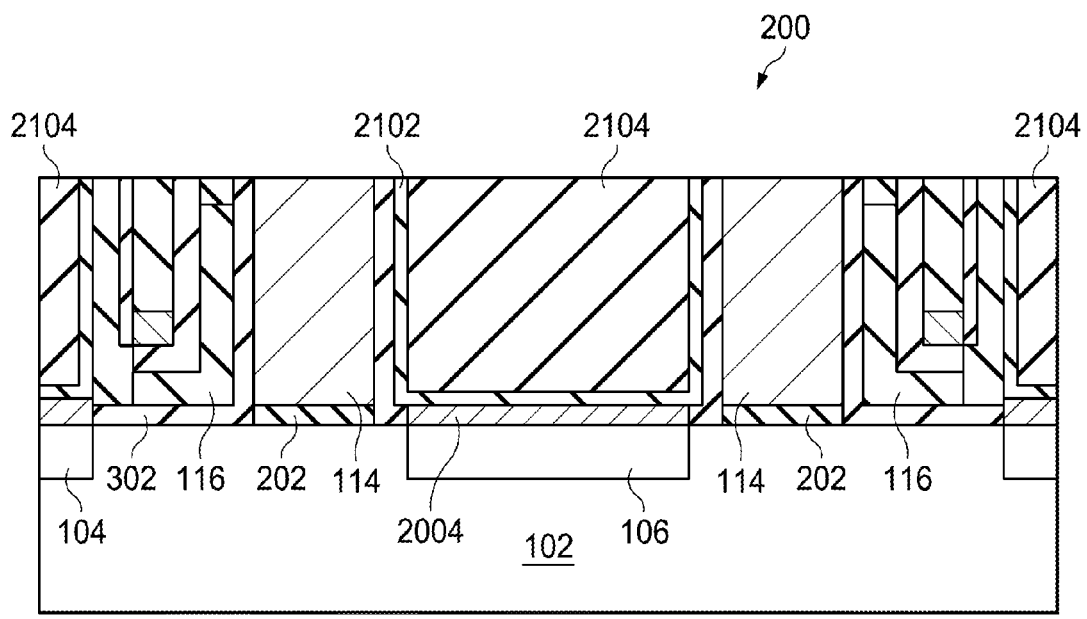
FIG. 22 illustrates a cross section view of the semiconductor device shown in FIG. 21 after a chemical mechanical polish (CMP) process is applied to the top surface of the semiconductor device in accordance with various embodiments of the present disclosure.

FIG. 22 illustrates a cross section view of the semiconductor device shown in FIG. 21 after a chemical mechanical polish (CMP) process is applied to the top surface of the semiconductor device in accordance with various embodiments of the present disclosure. A planarization process, such as CMP, etch back step and the like, may be performed to planarize the top surface of the ILD layer 2104. As shown in FIG. 22, a portion of the ILD layer 2104 has been removed as a result.

Figure 23:
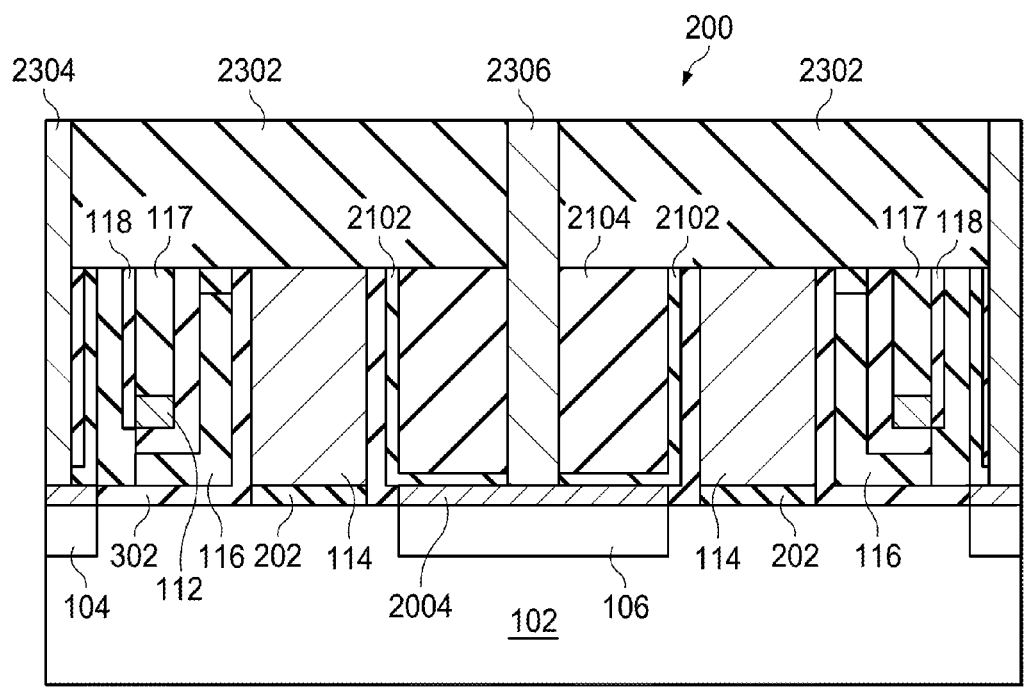
FIG. 23 illustrates a cross section view of the semiconductor device shown in FIG. 22 after a variety of contacts are formed in the semiconductor device in accordance with various embodiments of the present disclosure.

FIG. 23 illustrates a cross section view of the semiconductor device shown in FIG. 22 after a variety of contacts are formed in the semiconductor device in accordance with various embodiments of the present disclosure. A dielectric layer 2302 may be formed over the ILD layer 2104. A plurality of openings (not shown) may be formed by etching the dielectric layer 2302 as well as the ILD layer 2104. With the help of the CESL layer 2102, the etching process of the dielectric layer 2302 and the ILD layer 2104 is more precisely controlled. The CESL layer 2102, the ILD layer 2104 and the dielectric layer 2302 in the openings are also removed, thereby exposing the underlying silicide regions over the drain/source regions 104 and 106.

A metallic material, which includes tungsten, titanium, aluminum, copper, any combinations thereof and/or the like, is filled into the openings, forming contact plugs 2304 and 2306.

Figure 24:
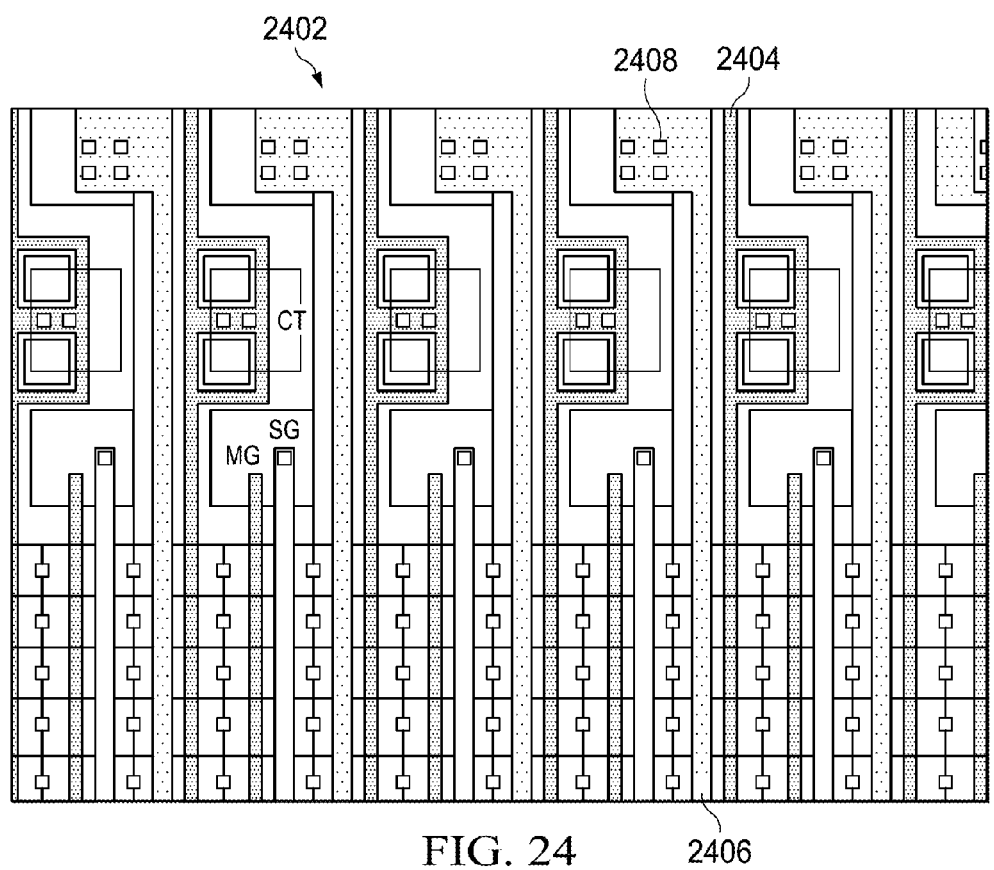
FIG. 24 illustrates a top view of a memory structure in accordance with various embodiments of the present disclosure.

FIG. 24 illustrates a top view of a memory structure in accordance with various embodiments of the present disclosure. The memory structure 2402 includes a plurality of memory cells arranged in rows and columns. As shown in FIG. 24, a memory gate structure 2404 and the control gate structure 2406 are placed in parallel.

The control gate structure 2406 has its own contacts 2408 as shown in FIG. 24. The formation of the contacts of the memory gate structure 2404 includes forming an opening adjacent to the memory gate structure 2404, filling a conductive material or a variety of conductive materials into the opening to form a conductive region (not shown), wherein the conductive region is electrically coupled to the memory gate structure 2404 and forming a plurality of contact plugs over the conductive region.

Figure 25:
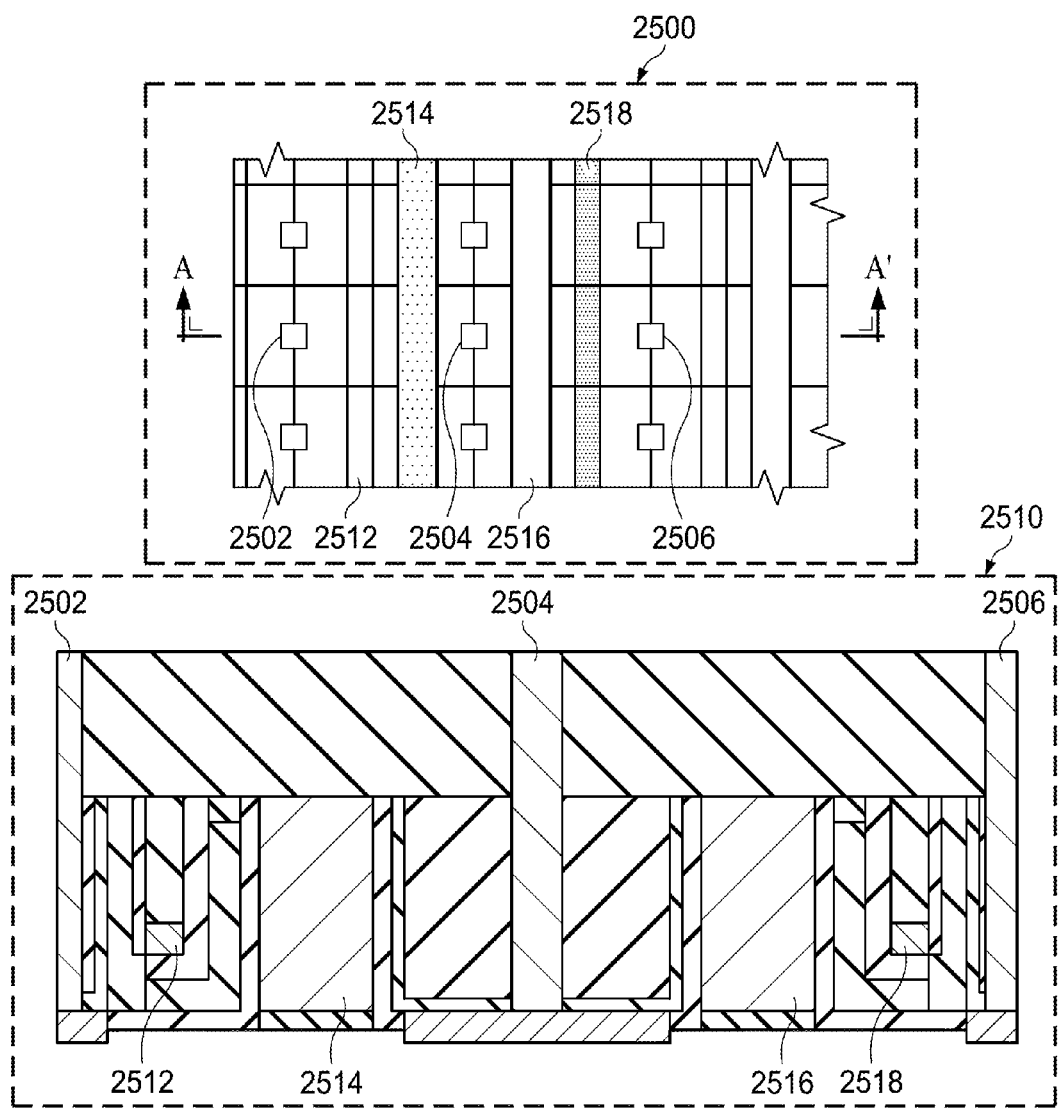
FIG. 25 illustrates a portion of the top view shown in FIG. 24 and a corresponding cross sectional view of the memory structure in accordance with various embodiments of the present disclosure.

FIG. 25 illustrates a portion of the top view shown in FIG. 24 and a corresponding cross sectional view of the memory structure in accordance with various embodiments of the present disclosure. The top view 2500 is a portion of the top view shown in FIG. 24. The top view 2500 illustrates a first memory gate 2512, a first control gate 2514, a second memory gate 2518 and a second control gate 2516. As shown in FIG. 25, the control gates and the memory gates are placed in parallel. The top view 2500 further illustrates three contacts 2502, 2504 and 2506, which are connected to drain/source regions of a memory structure.

The cross sectional view 2510 is taken along line A-A'. The detailed structures and fabrication steps of the memory structure shown in the cross sectional view 2510 have been described above, and hence are not discussed herein to avoid repetition.

In accordance with an embodiment, a method comprises forming a control gate structure over a substrate, depositing a charge storage layer over the control gate structure, depositing a memory gate layer over the charge storage layer, wherein the memory gate layer conforms to the charge storage layer, depositing a memory gate height controlling layer over the memory gate layer and applying an etch-back process to the memory gate layer, wherein, after the step of applying the etch-back process, a top surface of the memory gate layer is lower than a top surface of the memory gate height controlling layer.

The method further comprises depositing a first dielectric layer over the memory gate layer, applying a first etching process to the first dielectric layer and the memory gate layer to form a first memory gate structure, wherein the first memory gate structure is formed along a sidewall of the control gate structure and the first memory gate comprises a memory gate and a remaining portion of the first dielectric layer, forming a first spacer along a sidewall of the first memory gate structure, applying a second etching process to the charge storage layer to form an L-shaped charge storage layer and forming a second spacer over the memory gate structure.

In accordance with an embodiment, a method comprises forming a control gate structure over a substrate, forming an Oxide-Silicon-Oxide layer over the control gate structure, depositing a memory gate layer over the Oxide-Silicon-Oxide layer, wherein the memory gate layer is a conformal film and depositing a bottom anti-reflection coating layer over the memory gate layer, wherein the bottom anti-reflection coating layer partially fills an opening adjacent to the control gate structure.

The method further comprises applying an etch-back process to the memory gate layer until a top surface of a remaining portion of the memory gate layer is lower than a top surface of the bottom anti-reflection coating layer, depositing a memory gate spacer layer over the memory gate layer and the control gate structure, forming a first memory gate structure through a first etching process, wherein the first memory gate structure is formed along a sidewall of the control gate structure, forming a first spacer along a sidewall of the first memory gate structure, applying a second etching process to a silicon dot layer of the Oxide-Silicon-Oxide layer to form an L-shaped charge storage layer and forming a first drain/source region adjacent to the memory gate structure and a second drain/source region adjacent to the control gate structure.

In accordance with an embodiment, an apparatus comprises a control gate structure over a substrate, a memory gate structure over the substrate, wherein the memory gate structure comprises a memory gate electrode and a memory gate spacer, and wherein the memory gate spacer is over the memory gate electrode and a charge storage layer formed between the control gate structure and the memory gate structure, wherein the charge storage layer is an L-shaped structure.

The apparatus further comprises a first spacer along a sidewall of the memory gate structure, a first drain/source region formed in the substrate and adjacent to the memory gate structure and a second drain/source region formed in the substrate and adjacent to the control gate structure.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   forming a control gate structure over a substrate;
   depositing a charge storage layer over the control gate structure;
   depositing a memory gate layer over the charge storage layer, wherein the memory gate layer conforms to the charge storage layer;
   depositing a gate dimension controlling layer over the memory gate layer;
   applying an etch-back process to the memory gate layer;
   depositing a first dielectric layer over the memory gate layer;
   applying a first etching process to the first dielectric layer and the memory gate layer to form a first memory gate structure, wherein:
      the first memory gate structure is formed along a sidewall of the control gate structure; and
      the first memory gate comprises a memory gate and a remaining portion of the first dielectric layer;
   forming a first spacer along a sidewall of the first memory gate structure;
   applying a second etching process to the charge storage layer to form an L-shaped charge storage layer; and
   forming a second spacer over the memory gate structure.

2. The method of claim 1, further comprising:
   forming a first drain/source region adjacent to the memory gate structure and a second drain/source region adjacent to the control gate structure;
   forming a first salicide region over the first drain/source region; and
   forming a second salicide region over the second drain/source region.

3. The method of claim 1, further comprising:
   depositing a gate dielectric layer over the substrate;
   depositing a control gate electrode layer over the gate dielectric layer;

depositing a first hard mask layer over the control gate electrode layer;

depositing a second hard mask layer over the first hard mask layer; and forming the control gate structure through a patterning process.

4. The method of claim 1, further comprising:

forming a first oxide layer over the substrate and the control gate structure;

forming the charge storage layer over the first oxide layer, wherein the charge storage layer is a silicon dot layer; and forming a second oxide layer over the charge storage layer.

5. The method of claim 4, wherein:

the first oxide layer is of a thickness of about 50 angstrom;

the charge storage layer is of a thickness of about 100 angstrom; and the second oxide layer is of a thickness of about 100 angstrom.

6. The method of claim 1, wherein:

the remaining portion of the first dielectric layer is over the memory gate.

7. The method of claim 1, wherein:

the gate dimension controlling layer is a bottom anti-reflection coating (BARC) layer.

8. The method of claim 1, further comprising:

forming a contact etch stop layer (CESL) over the memory gate structure and the control gate structure;

depositing an inter-layer dielectric layer over the contact etch stop layer, wherein the memory gate structure and the control gate structure are embedded in the inter-layer dielectric layer;

performing a chemical mechanical polishing process on the inter-layer dielectric layer until a top surface of the control gate is exposed; and forming contact plugs coupled to a first drain/source region and a second drain/source region.

9. A method comprising:

forming a control gate structure over a substrate;

forming an Oxide-Silicon-Oxide layer over the control gate structure;

depositing a memory gate layer over the Oxide-Silicon-Oxide layer, wherein the memory gate layer is a conformal film;

depositing a bottom anti-reflection coating layer over the memory gate layer, wherein the bottom anti-reflection coating layer partially fills an opening adjacent to the control gate structure;

applying an etch-back process to the memory gate layer;

depositing a memory gate spacer layer over the memory gate layer and the control gate structure;

forming a first memory gate structure through a first etching process, wherein the first memory gate structure is formed along a sidewall of the control gate structure;

forming a first spacer along a sidewall of the first memory gate structure;

applying a second etching process to a silicon dot layer of the Oxide-Silicon-Oxide layer to form an L-shaped charge storage layer; and forming a first drain/source region adjacent to the memory gate structure and a second drain/source region adjacent to the control gate structure.

10. The method of claim 9, further comprising:

applying a third etching process to an oxide layer of the Oxide-Silicon-Oxide layer.

11. The method of claim 9, wherein:

a gap between a remaining portion of the memory gate layer and a top surface of the bottom anti-reflection coating layer is about 100 angstroms.

12. The method of claim 9, further comprising:

forming an opening adjacent to the memory gate structure;

filling a plurality of conductive materials into the opening to from a conductive region, wherein the conductive region is electrically coupled to the memory gate structure; and forming a contact plug over the conductive region, wherein the contact plug is electrically coupled to the conductive region.

13. The method of claim 9, wherein:

during the step of forming the first memory gate structure through the first etching process, critical dimensions of the memory gate structure is determined by a thickness of a sidewall portion of the memory gate spacer layer.

14. The method of claim 9, wherein:

the first memory gate structure comprises a memory gate and a spacer formed over the memory gate, wherein a height of the memory gate is determined by a thickness of the bottom anti-reflection coating layer.

15. A method comprising:

depositing a charge storage layer over a control gate structure;

depositing a memory gate layer over the charge storage layer;

depositing a bottom anti-reflection coating layer, wherein the bottom anti-reflection coating layer is over a bottom portion of the memory gate layer and between two sidewall portions of the memory gate layer;

applying an etch-back process to the memory gate layer;

depositing a first dielectric layer over the memory gate layer;

applying a first etching process to the first dielectric layer and the memory gate layer to form a first memory gate structure;

forming a first spacer along a sidewall of the first memory gate structure;

applying a second etching process to the charge storage layer to form an L-shaped charge storage layer; and forming a second spacer over the memory gate structure.

16. The method of claim 15, wherein:

the first memory gate structure is formed along a sidewall of the control gate structure.

17. The method of claim 15, wherein:

the first memory gate comprises a memory gate and a remaining portion of the first dielectric layer.

18. The method of claim 15, further comprising:

after the step of applying the etch-back process to the memory gate layer, removing the bottom anti-reflection coating layer using an etching process.

19. The method of claim 15, further comprising:

depositing a first oxide layer over the control gate structure;

depositing a silicon dot layer over the first oxide layer; and depositing a second oxide layer over the silicon dot layer.

20. The method of claim 15, further comprising:

forming a first drain/source region adjacent to the memory gate structure and a second drain/source region adjacent to the control gate structure.

\* \* \* \* \*